(12) United States Patent
Marr (10) Patent No.: US 7,836,362 B2
(45) Date of Patent: Nov. 16, 2010

(54) CIRCUITS AND METHODS FOR REPAIRING DEFECTS IN MEMORY DEVICES

(75) Inventor: Kenneth W. Marr, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1094 days.

(21) Appl. No.: 11/492,254

(22) Filed: Jul. 25, 2006

(65) Prior Publication Data

US 2007/0168772 A1   Jul. 19, 2007

Related U.S. Application Data (62) Division of application No. 10/609,312, filed on Jun. 24, 2003, now Pat. No. 7,437,632.

(51) Int. Cl.
G06F 11/00 (2006.01)
G11C 29/00 (2006.01)
G11C 7/00 (2006.01)

(52) U.S. Cl. .................. 714/711; 714/718; 365/201

(58) Field of Classification Search .............. 714/710, 714/711, 718, 723; 365/201
See application file for complete search history.

(56) References Cited

U.S. PATENT DOCUMENTS

| | | | |
|---|---|---|---|
| 4,546,455 A | 10/1985 | Iwahashi et al. | |
| 4,639,895 A | 1/1987 | Iwahashi et al. | |
| 4,780,851 A | 10/1988 | Kurakami et al. | |
| 5,097,448 A | 3/1992 | Segawa | |
| 5,235,548 A | 8/1993 | Kurkowski | |
| 5,262,993 A | 11/1993 | Horiguchi et al. | |
| 5,349,558 A | 9/1994 | Cleveland et al. | |
| 5,519,650 A | 5/1996 | Ichimura et al. | |
| 5,594,694 A * | 1/1997 | Roohparvar et al. | ........ 365/201 |
| 5,795,797 A | 8/1998 | Chester et al. | |
| 5,907,515 A | 5/1999 | Hatakeyama | |
| 5,946,257 A | 8/1999 | Keeth | |

(Continued)

FOREIGN PATENT DOCUMENTS

| | | |
|---|---|---|
| EP | 0480915 A1 | 4/1992 |
| JP | 02-098899 | 4/1990 |
| JP | 11353894 A * | 12/1999 |

OTHER PUBLICATIONS

"Abnormal leakage suppression (ALS) scheme for low standby current SRAMs" by Kanda et al. This paper appears in: Solid-State Circuits Conference, 2001. Digest of Technical Papers. ISSCC. 2001 IEEE International Publication Date : 2001 on pp. 174-175, 444 ISBN: 0-7803-6608-5 INSPEC Accession No. 6912691.*

(Continued)

Primary Examiner—Cynthia Britt
(74) Attorney, Agent, or Firm—Schwegman, Lundberg & Woessner, P.A.

(57) ABSTRACT

Some embodiments of the invention include a memory device has a number of memory segments connected to a supply source through a supply control circuit. The supply control circuit isolates a selected memory segment from the supply source when the selected memory segment is defective. The memory device replaces a defective memory segment with a redundant segment. Other embodiments are described and claimed.

12 Claims, 12 Drawing Sheets

U.S. PATENT DOCUMENTS

| | | | |
|---|---|---|---|
| 5,956,275 | A | 9/1999 | Duesman |
| 6,078,540 | A | 6/2000 | Keeth |
| 6,115,301 | A | 9/2000 | Namekawa |
| 6,185,136 | B1 | 2/2001 | Shirley |
| 6,249,465 | B1 | 6/2001 | Weiss et al. |
| 6,356,498 | B1 | 3/2002 | Keeth |
| 6,366,509 | B2 | 4/2002 | Shirley |
| 6,510,533 | B1 | 1/2003 | Siek et al. |
| 6,574,159 | B2 | 6/2003 | Ohbayashi et al. |
| 6,587,386 | B2 | 7/2003 | Blodgett |
| 6,665,221 | B2 | 12/2003 | Abedifard et al. |
| 6,671,214 | B2 | 12/2003 | Abedifard et al. |
| 6,731,561 | B2 * | 5/2004 | Abe et al. ............ 365/226 |
| 6,934,202 | B2 | 8/2005 | Ferrant |
| 7,437,632 | B2 | 10/2008 | Marr |
| 2003/0231534 | A1 | 12/2003 | Takami |
| 2005/0015654 | A1 | 1/2005 | Marr |
| 2007/0168771 | A1 | 7/2007 | Marr |

OTHER PUBLICATIONS

Shibata et al., "A 1-V, 10-MHz, 3.5-mW, 1-Mb MTCMOS SRAM: with charge-recycling input/output buffers," Solid-State Circuits, IEEE Journal of, vol. 34, No. 6, pp. 866-877, Jun. 1999.*

Kim, Heon-Cheol, "A BISR (built-in self-repair) circuit for embedded memory with multiple redundancies", *6th International Conference on VLSI and CAD, 1999. ICVC*, (1999), 602-605.

Tarr, M., et al., "Defect Analysis System Speeds Test and Repair of Redundant Memories", *Electronics*, 57, (Jan. 1984), 175-179.

Kokkonen, K., et al., "Redundancy techniques for fast static RAMs", *1981 IEEE International Solid-State Circuits Conference. Digest of Technical Papers*, vol. XXIV, (Feb. 1981), 80-81.

Tanoi, S., ""BIST: required for embedded DRAM,"", vol., no., pp. 1149, Test Conference, 1998. Proceedings., International, doi: 10.1109/TEST.1998.743349, (Oct. 18-23, 1998), 1 Pg.

* cited by examiner

CIRCUITS AND METHODS FOR REPAIRING DEFECTS IN MEMORY DEVICES

RELATED APPLICATIONS

This application is a Divisional of U.S. application Ser. No. 10/609,312, filed Jun. 24, 2003, now U.S. Pat. No. 7,437,632, which is incorporated herein by reference.

FIELD

The embodiments of the invention relate generally to semiconductor devices, more particularly to repairing defects in memory devices.

BACKGROUND

Memory devices reside in many computers and electronic products to store data.

A typical memory device has many memory cells and some redundant (spare) cells. When some of the memory cells are defective, the defective memory cells can be replaced with redundant cells to repair the memory device. This repairing method saves the entire memory device when only a few memory cells are defective.

Certain defects are repairable. Some defects are irreparable, causing the entire memory device to be discarded.

DETAILED DESCRIPTION OF THE EMBODIMENTS

The following description and the drawings illustrate specific embodiments of the invention sufficiently to enable those skilled in the art to practice the embodiments of the invention. Other embodiments may incorporate structural, logical, electrical, process, and other changes. In the drawings, like numerals describe substantially similar components throughout the several views. Examples merely typify possible variations. Portions and features of some embodiments may be included in or substituted for those of others. The scope of the invention encompasses the full ambit of the claims and all available equivalents.

Figure 1:
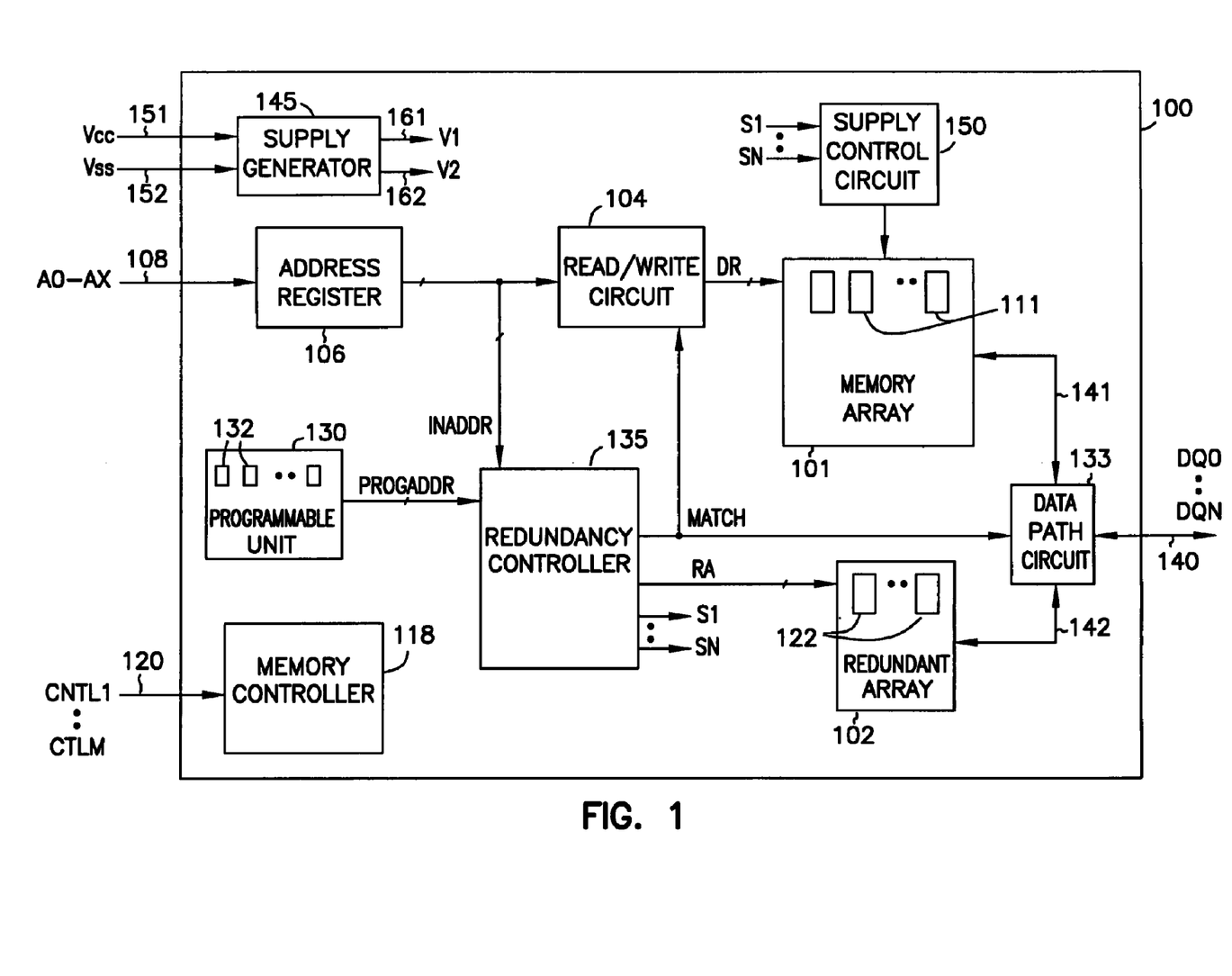
FIG. 1 shows a memory device according to an embodiment of the invention.

FIG. 1 shows a memory device according to an embodiment of the invention. Memory device 100 includes a memory array 101 and a redundant array 102. Memory array 101 includes a number of memory segments 111. Redundant array 102 includes a plurality of redundant segments 122. Each of the redundant segments 122 can replace a defective memory segment among memory segments 111.

A read/write circuit 104 accesses memory array 101 using memory access signals DR in response to input address INADDR signals provided by an address register 106. The INADDR signals are derived from address signals A0-AX provided to address register 106 from address lines 108. Data signals DQ0-DQN on data lines 140 represent data transferred to and from memory array 101 and redundant array 102 via a data path circuit 133. Lines 141 carry data transferred between memory array 101 and data path circuit 133. Lines 142 carry data transferred between redundant array 101 and data path circuit 133.

A memory controller 118 controls the operations of memory device 100 based on control signals CTL1-CTLM on control lines 120.

A programmable unit 130 includes a plurality of programmable elements 132. Examples of programmable elements 132 include fuses, anti-fuses, and flash EEPROM cells. Other types of programmable elements can be also used. Programmable elements 132 can be programmed (configured) to store addresses of one or more defective memory segments of memory array 101. Programmable unit 130 provides programmed address signals PROGADDR, which represent addresses of defective memory segments of memory array 101.

A redundancy controller 135 controls access to redundant array 102 using a match signal MATCH and redundant access signals RA based on input address signals INADDR and the programmed address signals PROGADDR. Redundancy controller 135 also controls the states (signal levels) of a plurality of select signals S1 through SN based on the PROGADDR signals.

Memory device 100 has supply nodes 151 and 152 for receiving supply (power) sources Vcc and Vss. In some embodiments, Vcc is a positive voltage and Vss is ground. A supply generator 145 generates supply voltages V1, V2 on supply nodes 161 and 162. Each of the V1 and V2 is function of Vcc and Vss. In embodiments represented by FIG. 1, V1 equals Vcc, V2 equals Vss, and Vss is ground. In some embodiments, V1 and V2 are non-ground and V1 is greater than V2. In some other embodiments, supply generator 145 is omitted, node 151 connects directly to node 161 and node 152 connects directly to node 162.

During an operation of memory device 100, the INADDR signals, derived from the A0-AX signals, represent addresses of memory cells 111 to be accessed. Redundancy controller 135 compares the INADDR signals and the PROGADDR signals. A mismatch between these signals indicates that the address represented by the INADDR signals correspond to a non-defective (good) memory segment of memory array 101. A match between these signals indicates that the address represented by the INADDR signals correspond to a defective memory segment of memory array 101.

In the mismatch case, redundancy controller 135 keeps both MATCH and RA signals inactivated. Write/read circuit 104 accesses memory cells of memory array 101 based on input addresses provided by address register 106. Data represented by the DQ0-DQN signals are transferred to and from memory array 101 via lines 141.

In the match case, redundancy controller 135 activates the MATCH signal to prevent write/read circuit 104 from accessing memory array 101, and activates the RA signal to access redundant array 102 based on the INADDR signals. Data represented by the DQ0-DQN signals are transferred to and from redundant array 101 via lines 142.

A supply control circuit 150 controls supply sources provided to memory array 101. In some embodiments, the supply sources include current, or voltage, or both. In embodiments represented by FIG. 1, the supply source includes either one of or a combination of Vcc, Vss, V1 and V2. Supply control circuit 150 receives the S1-SN signals from redundancy controller 135 to control the supply sources provided to memory array 101. When memory array 101 has a defective memory segment, supply control circuit 150 isolates (disconnects) the defective memory segment from the supply source to save power.

Memory device 100 also has other circuit elements, for example, decoders, sense amplifiers, which are not shown for simplicity. Further, each of the INADDR, PROGADDR, DR, and RA signals represents multiple signals carried by multiple lines; however, each of these signals is shown as a single signal on a single line for simplicity.

Memory device 100 can be a static random access memory device (SRAM), a dynamic random access memory device (DRAM), a flash memory device, or other types of memory devices.

Figure 2:
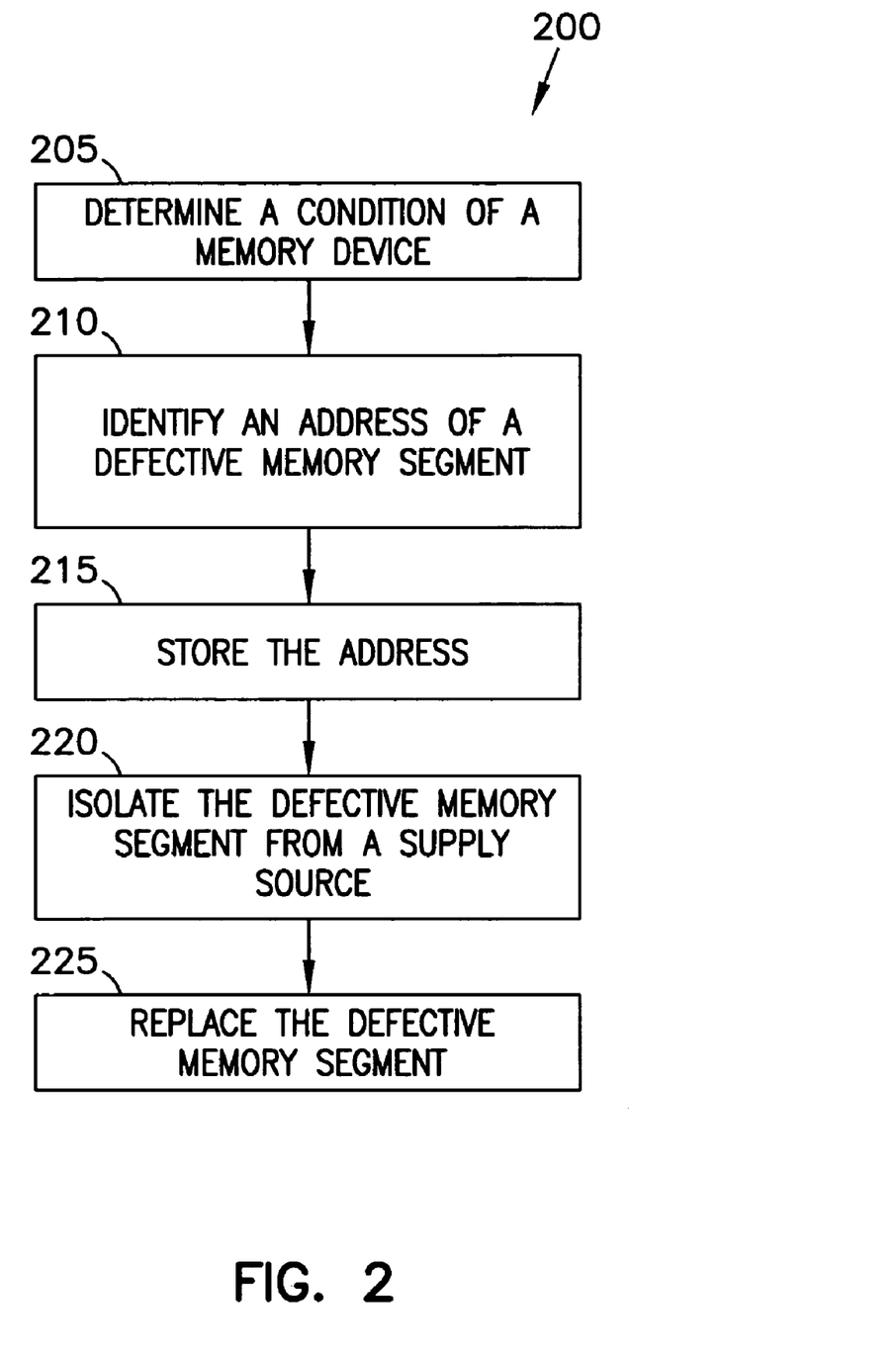
FIG. 2 shows a flow chart of a method of repairing a memory device according to an embodiment of the invention.

FIG. 2 shows a flow chart of a method of repairing a memory device according to an embodiment of the invention. Method 200 can be used to repair memory device 100 (FIG. 1). In FIG. 2, box 205 of method 200 determines a condition of a memory array such as memory array 101. If the memory array has a defective memory segment, box 210 identifies the address of the defective memory segment. Box 215 stores the address of the defective memory segment. The address can be stored in a unit such as programmable unit 130 (FIG. 1). Box 220 isolates the defective memory segment from a supply source such as supply source Vcc, Vss, V1 or V2 to save power. Box 225 replaces the defective memory segment with a redundant segment such as redundant segment 122 (FIG. 1) so that the original capacity of the memory array remains unchanged.

Determining the condition of the memory array (box 205) can be achieved by various techniques. One of the techniques involves detecting for a defect during a test in which test data is written to the memory array. The data is subsequently read from the memory array and is compared with the test data to detect for errors. Certain errors indicate a defect existed in the memory array. The errors are analyzed to determine the type of defect. In some embodiments, the errors are analyzed by comparing them with known errors. The known errors are caused by known types of defects. For example, certain known errors are caused by defects that involve charge leakage between adjacent memory segments or memory cells of the memory array. Some known errors are caused by defects that involve circuit shorts between internal nodes of the memory array in which the internal nodes connect to the supply source supplied to the memory array.

After the type of defect is determined and the address of the defective memory segment is identified (box 210), the address is stored. Storing the address (box 215) can be done by programming elements such as programmable elements 132 (FIG. 1). In some embodiments, the programming includes blowing fuses, applying programming voltage to anti-fuses, or other programming method. Based on the address programmed in the programming unit, the defective memory segment is isolated from the supply source.

Isolating the defective memory segment from the supply source (box 220) can be achieved by a unit such as supply control circuit 150 (FIG. 1). In some embodiments, isolating the defective memory segment from the supply source includes preventing the defective memory segment from drawing current in a current path supplied to the defective memory segment. In other embodiments, isolating the defective memory segment from the supply source includes electrically disconnecting the defective memory segment from a supply voltage. When the defective memory segment is isolated, it is replaced by a redundant segment.

In some embodiments, replacing the defective memory segment (box 225) includes rerouting an access route connected to the defective memory segment with an access route connected to a redundant segment. The rerouting can be performed by a redundancy controller similar to redundancy controller 135 (FIG. 1).

Figure 3:
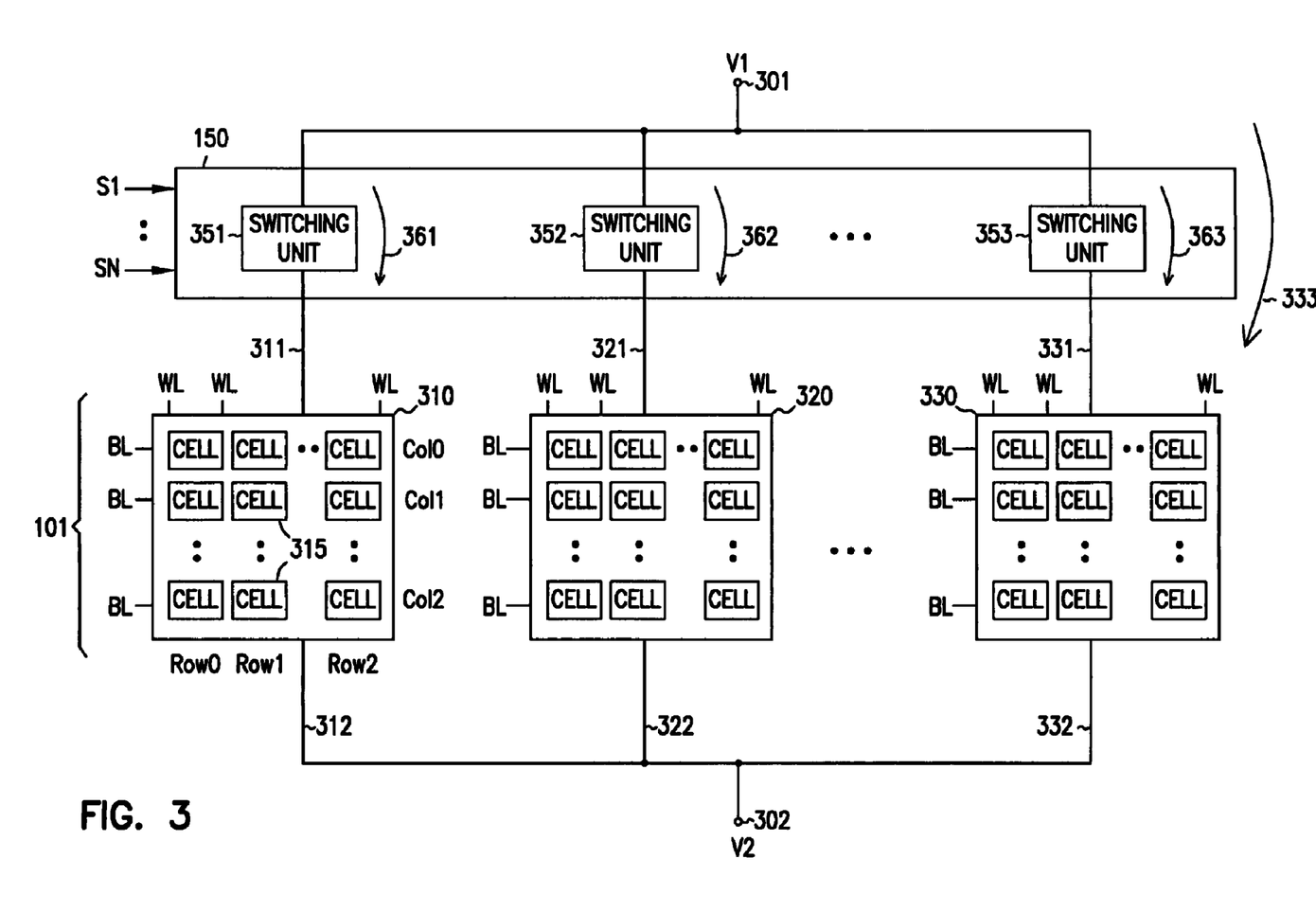
FIG. 3 shows a portion of the memory device of FIG. 1.

FIG. 3 shows a portion of the memory device of FIG. 1. Memory array 101 connects to supply node 301 via a supply path 333. Supply path 333 represents a combination of supply paths 361, 362, and 363. Each of the supply paths 361, 362, and 363 connects between supply node 301 and one of the first internal nodes 311, 321, and 331. Supply control circuit 150 connects in supply path 333 and in series with memory array 101 between supply node 301 and supply node 302. Supply node 301 receives a supply voltage V1. Supply node 302 receives to a supply voltage V2. V1 and V2 correspond to V1 and V2 of FIG. 1. In some embodiments, V1 is a positive voltage and V2 is ground.

Memory array 101 includes a number of memory segments 310, 320, and 330. For simplicity, FIG. 3 shows only three memory segments. However, memory array 101 can have N memory segments where N is an integer. In FIG. 3, N equals three.

Memory segments 310, 320, and 330 connect in parallel with each other between first internal nodes 311, 321, and 331 and a plurality of second internal nodes 312, 322, and 332. Each of the memory segments connects between one of the first internal nodes and one of the second internal nodes. For example, memory segment 310 connects between internal nodes 311 and 312.

Each of the memory segments includes a number of memory cells 315 arranged in rows and columns. For example, memory segment 310 has memory cells 315 arrange in rows Row0, Row1, and Row2 and in columns Col0, Col1, and Col3. In some embodiments, memory segments 310, 320, and 330 have equal number of memory cells. In this specification, a memory cell group refers to either each of the rows or each of the columns. Memory cells 315 connect to word lines WL and bit lines BL.

Supply control circuit 150 includes a number of switching units 351, 352, and 353 and input nodes to receive the select signals S1-SN. In some embodiments, the number of the switching units equals N, which is the number of memory segments of memory array 101. Each of the switching units connects in one of the supply path 361, 362, and 363 and in series with a corresponding memory segment and a corresponding internal node. For example, switch unit 351 connects in supply path 361 and in series with corresponding memory segment 310 corresponding and internal node 311.

Each switching unit has an enable mode and a disable mode; these modes are controlled by the S1-SN signals. In some embodiments, one of the S1-SN signals controls one of the switching units to switch the switching unit between the enable and disable modes. In some embodiments, the enable and disable modes of the switching units depend on the states of the S1-SN signals. For example, when the S1 signal is used to control switching unit 310, a low signal level of the S1 signal can be used to switch switching unit 351 to the enable mode; and a high signal level of the S1 signal can be used to switch switching unit 351 to the disable mode.

When a switching unit is in the enable mode, it allows the corresponding memory segment to receive the supply sources from supply nodes 301 and 302. When a switching unit is in the disable mode, it prevents the corresponding memory segment from receiving the supply source from supply nodes 301 and 302. For example, when switching unit 351 is in the enable mode, it allows memory segment 310 to receive V1 and V2 from supply nodes 301 and 302; when switching unit 351 is in the disable mode, it prevents memory segment 310 from receiving V1 and V2 from supply nodes 301 and 302.

In some embodiments, when a switching unit is in the enable mode, it connects supply node 301 to the corresponding internal node, thereby creating a conductive path between the supply node and the corresponding internal node. When a switching unit is in the disable mode, it isolates supply node 301 from the corresponding internal node, thereby prohibiting a conductive path from being created between the supply node and the corresponding internal node. In some embodiments when a switching unit isolates the corresponding memory segment from supply node 301, the switching unit electrically disconnects the corresponding internal node from supply node 301.

In some embodiments, each switching unit isolates the corresponding memory segment from supply node 301 when the corresponding memory segment has a defect. The defect may be caused by a circuit short between the first and second internal nodes connected to the same memory segment. For example, when a circuit short exists between internal nodes 311 and 312 connected to memory segment 310, switching unit 351 isolates memory segment 310 from supply node 301. Memory segments 320 and 330 remain connected to supply node 301 by switching units 352 and 353.

In some embodiments, each of the switching units 351, 352, and 353 has a resistance such that the voltage of the corresponding internal node (311, 321, or 331) is reduced from an initial voltage value to a reduced voltage value when a defect exists in the corresponding memory segment (310, 320, or 330). In some embodiments, the reduced voltage value is sufficient to indicate a circuit short between the corresponding internal node and supply node 302.

Figure 4:
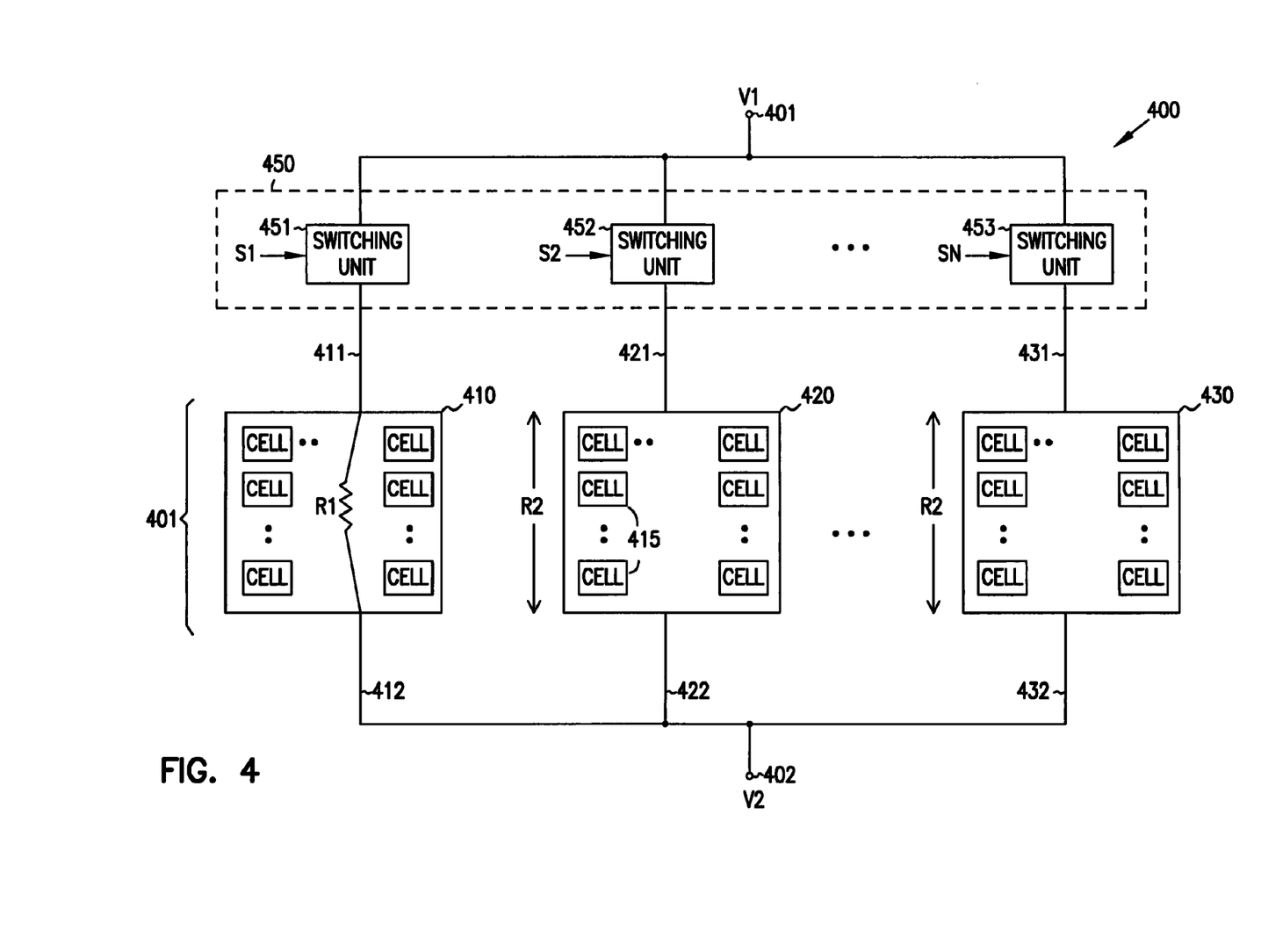
FIG. 4 shows a portion of a memory device having a defective memory segment according to an embodiment of the invention.

FIG. 4 shows a portion of a memory device having a defective memory segment according to an embodiment of the invention. Portion 400 includes elements similar to the elements of the portion of memory device 100 shown in FIG. 3. In FIG. 4, portion 400 includes supply nodes 401 and 402, a memory array 401 having a number of memory segments 410, 420, and 430, and a supply control circuit 450 having a number of switching units 451, 452, and 453. In FIG. 4, each of the switching units 451, 452 and 453 is controlled by one of the select signals S1-SN. For example, switching unit 451 is controlled by the S1 signal.

In FIG. 4, each of the memory segments has a number of memory cells 415 and connects between one of the internal nodes 411, 421, 431 and one of the internal nodes 412, 422, and 432. In some embodiments, memory segments 410, 420, and 430 have equal number of memory cells.

At least one of the memory segments 410, 420, and 430 is defective. For example, among the memory segments, memory segment 410 is defective and memory segments 420 and 430 are not defective. A resistor symbol R1 represents a defect in memory segment 403. R1 is not an actual resistor; R1 is shown for the purposes of showing a defect. In some embodiments, R1 represents a defect caused by a circuit short between internal nodes 411 and 412.

The each of the non-defective memory segments 420 and 430 has a resistance measured between the corresponding internal nodes. For example, each of the memory segments 420 and 430 has a resistance R2, which is measured between internal nodes 421 and 422, or between internal nodes 431 and 432.

In some embodiments, the resistance measured between the corresponding internal nodes of a defective memory segment is unequal to the resistance measured between the corresponding internal nodes of a non-defective memory segment. Thus, in FIG. 4, R1 is unequal to R2.

Supply control circuit 450 isolates a memory segment of memory array 403 from the supply node 401 when the memory segment is defective. In the above example where memory segment 410 is defective, switching unit 451 isolates memory segment 410 from supply node 401.

Figure 5:
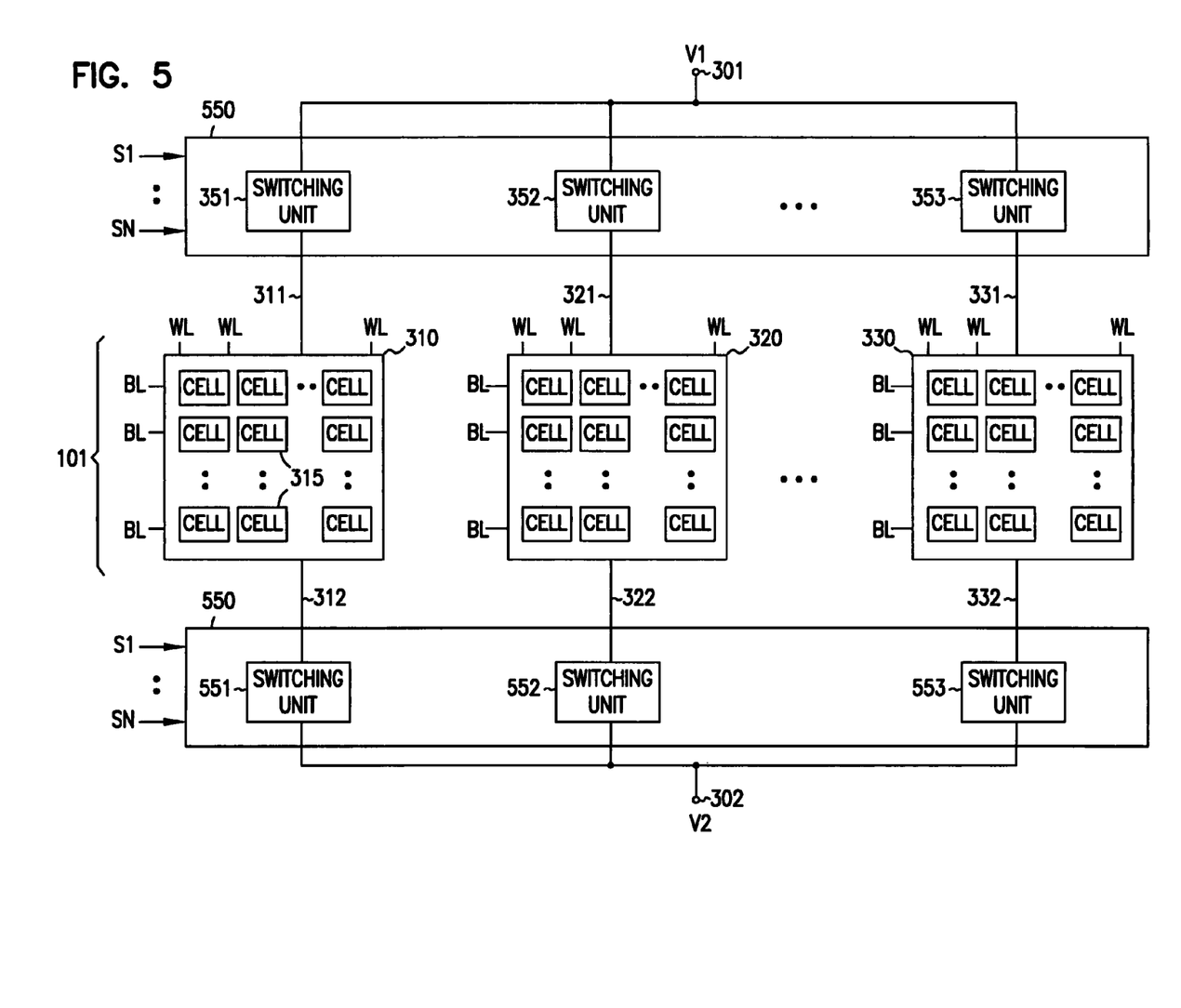
FIG. 5 shows an alternative embodiment of the portion of the memory device of FIG. 3.

FIG. 5 shows an alternative embodiment of the portion of the memory device of FIG. 3. For simplicity, similar elements in FIG. 3 and FIG. 5 have similar reference numbers. In FIG. 5, supply control circuit 550 includes switching units 551, 552, and 553 in addition to switching unit 351, 352, and 353. Thus, each memory segment has two corresponding switching units connected to it.

Each of the switching unit 551, 552, and 553 connects between supply nodes 302 and one of the internal nodes 312, 322, and 332 and has enable and disable modes similar to that of each of switching units 351, 352, and 353 (FIG. 3).

In some embodiments, all of the switching units of FIG. 5 have similar constructions and the select signals S1-SN can be used to control all of the switching units. In other embodiments, switching units 351, 352, and 353 have different constructions from switching units 551, 552, and 553. In these embodiments, the S1-SN signals can be used to control switching units 351, 352, and 353 and the derivatives of the S1-SN signals can be used to control switching units 551, 552, and 553. For example, inverted versions of the S1-SN signals can be used to control switching units 551, 552, and 553.

In some embodiments, at least one of the memory segments 310, 320, and 330 has a defect such as that of memory segment 410 (FIG. 4). In some cases, the defect is caused by a circuit short between internal nodes, for example, between internal nodes 311 and 312. In FIG. 5, when a memory segment has a defect, either one or both of the corresponding switching units is switched to the disable mode to isolate the memory segment from one or both of the supply nodes 301 and 302. For example, when memory segment 310 has a defect, one or both of the switching units 351 and 551 is switched to the disable mode to isolate memory segment 310 from one or both of the supply nodes 301 and 302.

Figure 6:
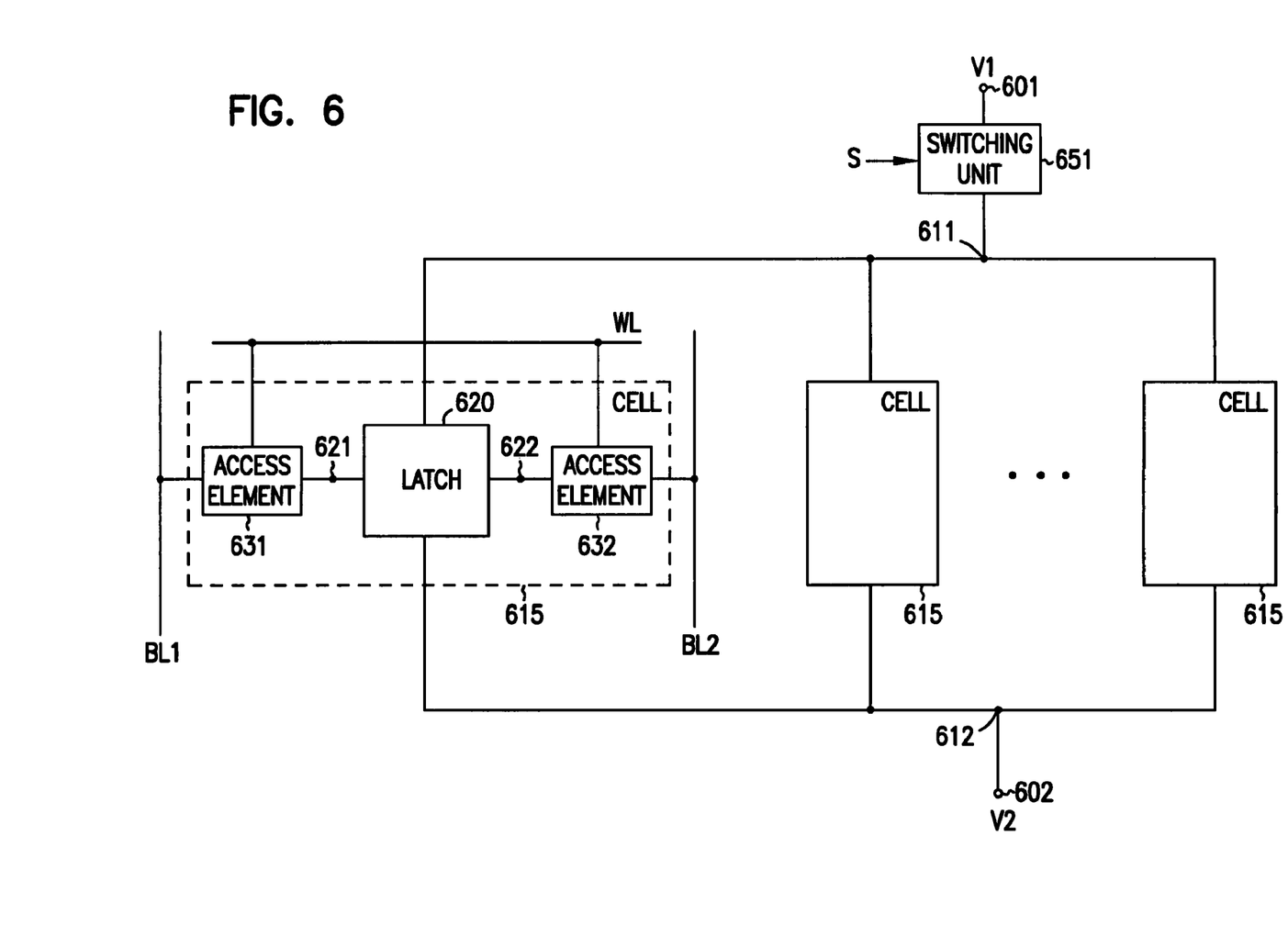
FIG. 6 shows a switching unit and multiple memory cells according to an embodiment of the invention.

FIG. 6 shows a switching unit and multiple memory cells according to an embodiment of the invention. Switch unit 651 correspond to one of the switching units 351, 352, and 353 (FIG. 3). Memory cells 615 correspond to memory cells 315 (FIG. 3). Thus, memory cells 615 of FIG. 6 correspond to either memory cells of one of the rows Row1, Row2, and Row3 or memory cells of one of the columns Col0, Col1, and Col2 (FIG. 3). In some embodiments, memory cells 315 are static memory cells.

Switching unit 651 connects between a first supply node 601 and an internal node 611. Each of the memory cells 615 connects between an internal node 611 and an internal node 612. A second supply node 602 connects to internal node 612. The internal nodes and the supply nodes in FIG. 6 correspond to that of FIG. 3. Switching unit 651 receives a select signal S, which corresponds to one of the S1-SN signals (FIG. 3).

For simplicity, only one of the memory cells 615 is shown in detail. Each of the memory cells 615 includes a latch 620 connected to a first storage node 621 and a second storage node 622. A first access element 631 connects between storage node 621 and a first bit line BL1 for accessing storage node 621. A second access element 632 connects between storage node 622 and a second bit line BL2 for accessing storage node 622. Both access elements connect to a word line WL.

In some embodiments, storage nodes 621 and 622 store data in complementary forms. For example, storage node 621 stores a data represented by a first voltage and storage node 622 stores a data represented by second voltage.

Switching unit 651 has enable and disable modes similar to that of each of the switching units 351, 352, and 353 (FIG. 3). The signal level of the S signal switches switching unit 651 between the enable and disable modes. In embodiments represented by FIG. 6, none of the memory cells is defective. Thus, switching unit 651 is switched to the enable mode.

In operation, certain signal level of the signal on word line WL activates access elements 631 and 632. Access element 631 transfers the data between storage node 621 and bit line BL1. Access element 632 transfers data between storage node 622 and bit line BL2. A data path such as data path circuit 133 (FIG. 1) carries the data transferred to and from storage nodes 621 and 622.

Figure 7:
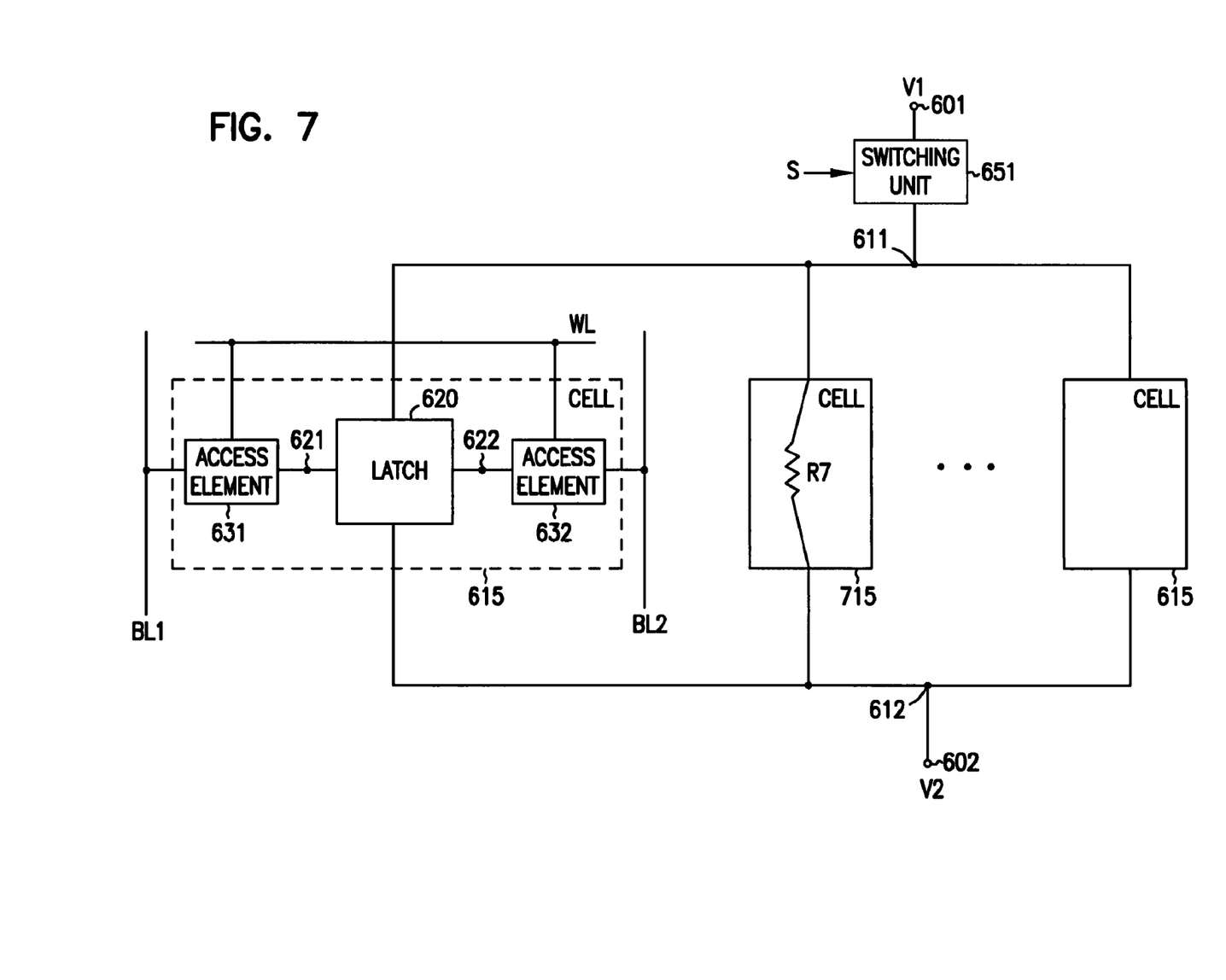
FIG. 7 shows the switching unit and the multiple memory cells of FIG. 6 in which at least one of the memory cells has a defect.

FIG. 7 shows the switching unit and the multiple memory cells of FIG. 6 in which at least one of the memory cells has a defect. In FIG. 7, memory cell 715 is defective; other memory cells are not defective. Resistance symbol R7 represents a defect in memory cell 715. In some embodiments, R7 represents a defect caused by a circuit short between internal nodes 611 and 612.

Since memory cell 715 is defective, switching unit 651 is switched to the disable mode to isolate internal node 611 from supply node 601, thereby isolating memory cell 715 from supply node 601. Since non-defective memory cells 615 also connect to internal node 611, they are also isolated from supply node 601.

In some embodiments, each of the memory cells 615 and 715 connects to supply node 601 through a separate switching unit. Thus, in those embodiments, non-defective memory cells such as memory cells 615 are not isolated from the supply node when one or more other memory cells are defective.

Figure 8:
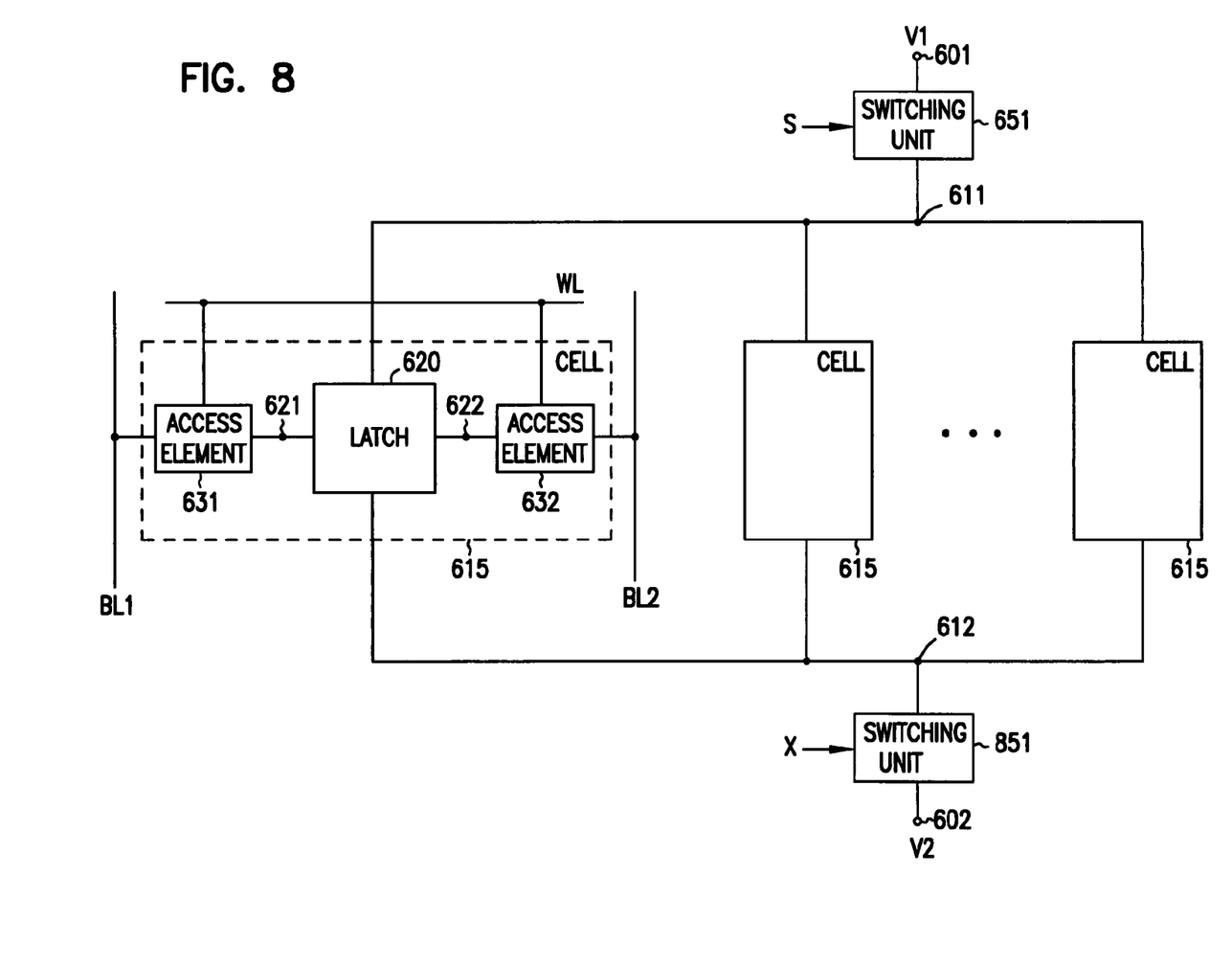
FIG. 8 shows multiple memory cells connected between two switching units according to an embodiment of the invention.

FIG. 8 shows multiple memory cells connected between two switching units according to an embodiment of the invention. The embodiments represented by FIG. 8 are alternative embodiments represented by FIG. 6. In FIG. 8, an additional switching unit 851 connects between internal node 612 and supply node 602. Switching unit 851 has enable and disable modes similar to that of switching unit 651. A select signal X switches switching unit 851 between the enable and disable modes. The X signal can be the same version or a derivative of the S signal.

In some embodiments, at least one of the memory cells 615 has a defect such as that of memory cell 715 (FIG. 7). In FIG. 8, when one of the memory cells 615 has a defect, either one or both of the switching units 615 and 851 is switched to the disable mode to isolate memory cells 615 from one or both of the supply nodes 601 and 602.

Figure 9:
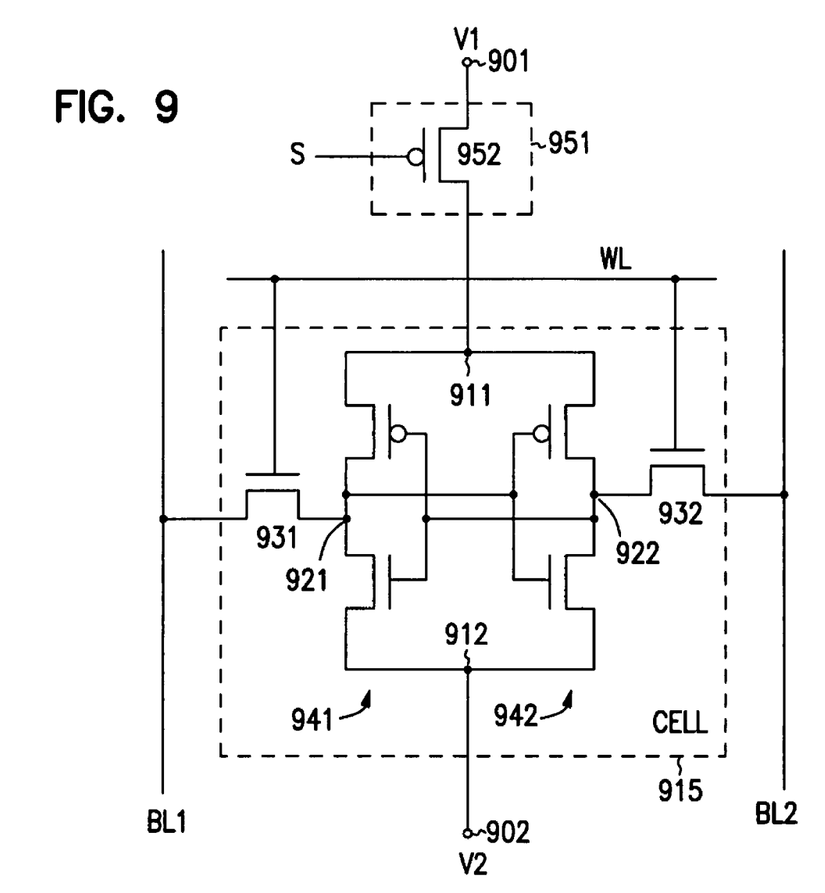
FIG. 9 shows a switching unit and a memory cell according to an embodiment of the invention.

FIG. 9 shows a switching unit and a memory cell according to an embodiment of the invention. Switching unit 951 includes a transistor 952 having a source and a drain connected between a supply node 901 and an internal node 911, and a gate for receiving the S signal. Transistor 952 is a p-channel transistor. However, transistor 952 can be an n-channel transistor. Other types of transistors can also be used.

A memory cell 915 includes a latch formed by a first transistor pair 941 and a second transistor pair 942. Transistor pair 941 has a common drain connected to storage node 921 and a common gate connected to storage node 922. Transistor pair 941 forms a first inverter with an output node being the common drain and the input node being the common gate. Transistor pair 942 has a common drain connected to second storage node 922 and a common gate connected to first storage node 921. Transistor pair 942 forms a second inverter with an output node being the common drain and the input node being the common gate. Transistor pairs 941 and 942 also connect together at internal nodes 911 and 912.

Switching units 951 corresponds to one of the switching units 351, 352, and 353 (FIG. 3). Memory cell 915 corresponds to one of memory cells 315 (FIG. 3) and one of the memory cells 615 (FIG. 6). The internal nodes and the supply nodes in FIG. 9 correspond to that of FIG. 3.

In FIG. 9, transistor 952 turns on and off based on the signal levels of the S signal. Transistor 952 turns on to connect memory cell 915 to supply node 901. Transistor 952 turns off to isolate (disconnects) memory cell 915 from supply node 901. In some embodiments, transistor 952 turns off when one of the memory cells 915 has a defect.

In some embodiments, transistor 952 has a resistance such that the voltage of internal node 911 is reduced from an initial voltage value to a reduced voltage value when a defect exists in one of the memory cells 915. In some embodiments, the reduced voltage value is sufficient to indicate a circuit short between the internal nodes 911 and 912.

Figure 10:
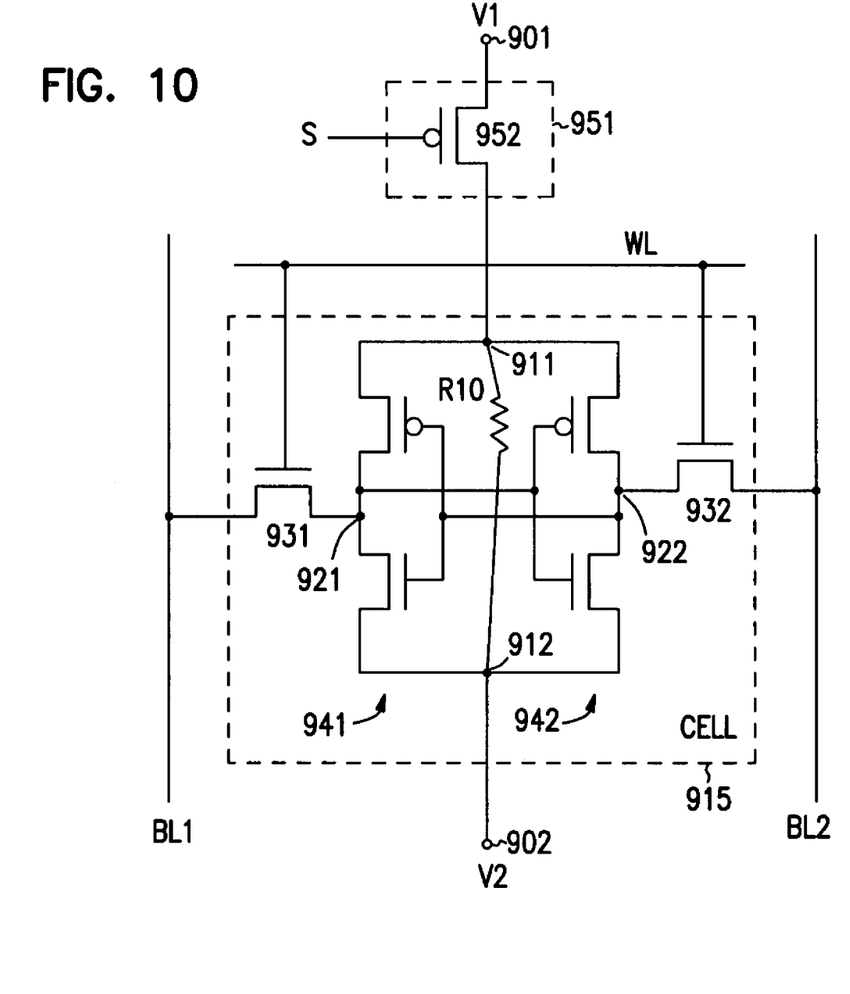
FIG. 10 shows the switching unit and the memory cell of FIG. 9 in which the memory cell has a defect.

FIG. 10 shows the switching unit and the memory cell of FIG. 9 in which one of the memory cells has a defect. In FIG. 10, the resistance symbol R10 represents a defect in one of the memory cells 915. In some embodiments, R10 represents a circuit short between internal nodes 911 and 912. Since memory cell 915 is defective, switching unit 951 is switched to the disable mode to isolate internal node 911 from supply node 901, thereby isolating the defective memory cell 915 from supply node 901.

Figure 11:
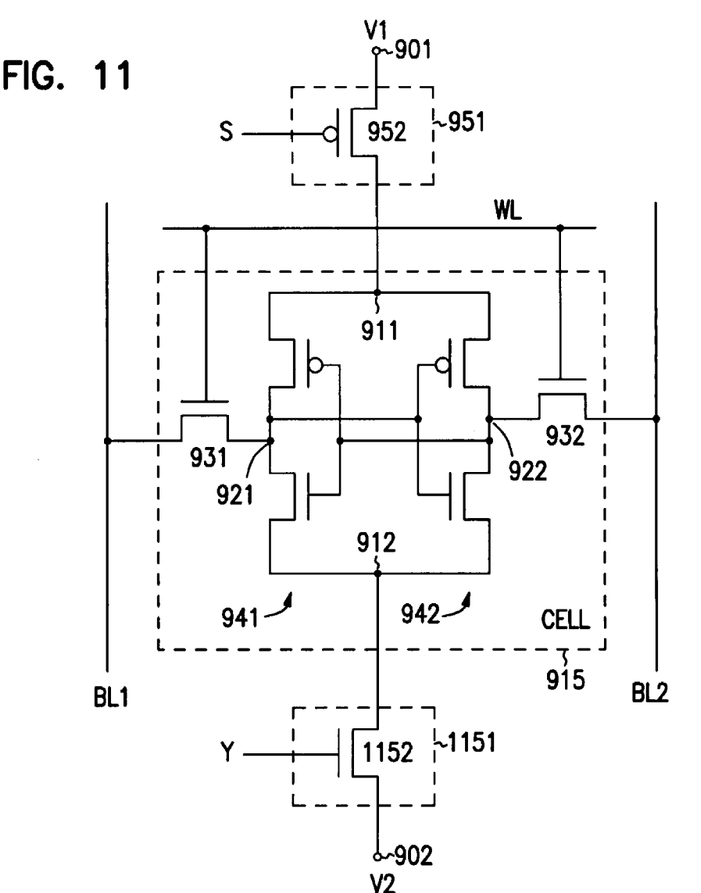
FIG. 11 shows a memory cell connected between two switching units according to an embodiment of the invention.

FIG. 11 shows a memory cell connected between two switching units according to an embodiment of the invention. The embodiments represented by FIG. 11 are alternative embodiments represented by FIG. 9. In FIG. 11, an additional switching unit 1151 connects between internal node 912 and supply node 902. Switching unit 1151 includes a transistor 1152 having a source and a drain connected between supply node 902 and internal node 912 and a gate for receiving a select signal Y. The Y signal can be an inverse of the S signal. Transistor 1152 is an n-channel transistor. However, transistor 1152 can be a p-channel transistor or other types of transistors.

In some embodiments, at least one of the memory cells 915 has a defect such as a defect represented by resistance R10 (FIG. 10). In FIG. 11, when one of the memory cells 915 has a defect, either one or both of the transistors 952 and 1152 turns off to isolate memory cells 915 from one or both of the supply nodes 901 and 902.

Figure 12:
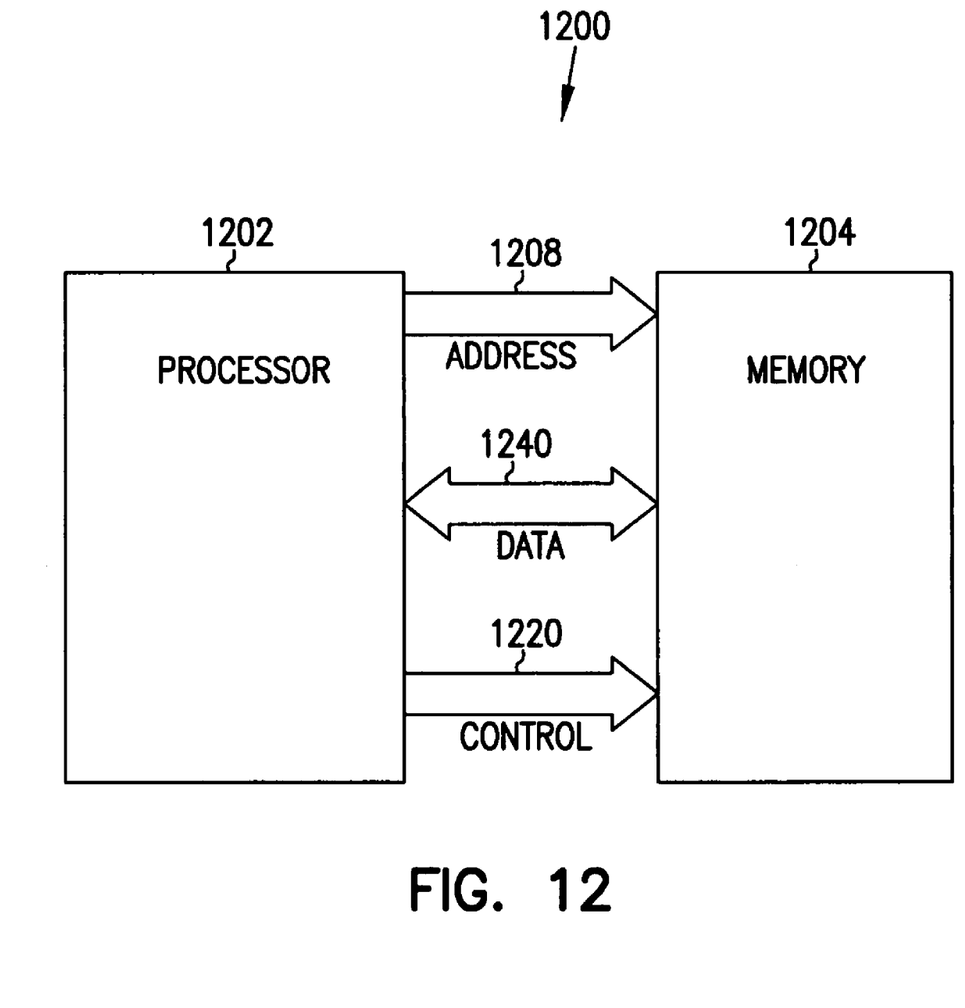
FIG. 12 shows a system according to an embodiment of the invention.

FIG. 12 shows a system according to an embodiment of the invention. System 1200 includes a first integrated circuit (IC) 1202 and a second IC 1204. ICs 1202 and 1204 include semiconductor devices. In some embodiments, ICs 1202 and 1204 include processors, controllers, memory devices, application specific integrated circuits, and other types of integrated circuits. In embodiments represented by FIG. 12, IC 1202 represents a processor and IC 1204 represents a memory device. Processor 1202 and memory device 1204 communicate using address signals on lines 1208, data signals on lines 1210, and control signals on lines 1220. In some embodiments, memory device 1204 has elements similar to the elements of memory device 100 (FIG. 1), lines 1208 corresponding to lines 108, lines 1220 corresponding to lines 120, and lines 1240 corresponding to lines 140.

System 1200 of FIG. 12 includes computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

CONCLUSION

Various embodiments of the invention provide circuits and methods for repairing defects in memory devices. Some embodiments of the inventions provide circuits and methods for repairing circuit shorts involving supply nodes of memory devices. Some embodiments of the invention include a memory device having a memory array connected to a supply node through a supply control circuit for receiving a supply source. When the memory array has a defective memory segment, the supply control circuit isolates the defective memory segment from the supply source to save power. The memory device replaces the defective memory segment with a redundant segment so that the memory device still has the full storage capacity. Other embodiments of the invention include a method of repairing a memory device. The method includes determining a condition of a plurality of memory segments. When a memory segment is defective, the method electrically disconnects the defective memory segment from a supply source. The method further replaces the defective memory segment with a redundant segment to maintain the full storage capacity of the memory device. Some other embodiments of the invention are described and claimed.

Although specific embodiments are described herein, those skilled in the art recognize that other embodiments may be substituted for the specific embodiments shown to achieve the same purpose. This application covers any adaptations or variations of the embodiments of the invention. Therefore, the embodiments of the invention are limited only by the claims and all available equivalents.

What is claimed is:

1. A device comprising:
a plurality of supply paths coupled to a supply node;
a plurality of memory segments, each of the memory segments being coupled to the supply node via one of the supply paths;
a plurality of switching units, each of the switching units being coupled to one of the supply paths and to a corresponding memory segment, the corresponding memory segment being one of the memory segments, wherein each of the switching units includes an enable mode for coupling the corresponding memory segment to the supply node, and a disable mode for decoupling the corresponding memory segment from the supply node, and wherein each of the switching units includes a transistor having a first terminal directly coupled to at least one memory cell included in one of the memory segments, a second terminal directly coupled to the supply node, and a gate to receive a signal; and
at least one redundant segment for replacing at least one memory segment of the plurality of memory segments.

2. The device of claim 1, wherein at least one of the memory segments is defective.

3. The device of claim 1, wherein each of the memory segments includes memory cells arranged memory cell groups, wherein at least one of the memory cell groups of at least one of the memory segments is defective.

4. The device of claim 1, wherein the transistor included in a corresponding switching unit among the switching units is configured to switch the corresponding switching unit between the enable and disable modes in response to the signal at the gate of the transistor.

5. The device of claim 1, wherein each of the switching units includes an input node coupled to the gate of the transistor to receive the signal to switch a corresponding switching unit to the disable mode when the corresponding memory segment is defective, the corresponding switching unit being one of the switching units.

6. The device of claim 1, wherein each of the switching unit includes a control input node coupled to the gate of the transistor to receive the signal to switch the corresponding switching unit to the enable mode when the corresponding memory segment is non-defective, the corresponding switching unit being one of the switching units.

7. A system comprising:
a processor; and
a static random access memory device coupled to the processor, the static random access memory device including:
a plurality of supply paths coupled to a supply node;
a plurality of memory segments, each of the memory segments being coupled to the supply node via one of the supply paths;
a plurality of switching units, each of the switching units being coupled to one of the supply paths and to a corresponding memory segment, the corresponding memory segment being one of the memory segments, wherein each of the switching units includes an enable mode for coupling the corresponding memory segment to the supply node, and a disable mode for decoupling the corresponding memory segment from the supply node, and wherein each of the switching units includes a transistor having a first terminal directly coupled to at least one memory cell included in one of the memory segments, a second terminal directly coupled to the supply node, and a gate to receive a signal; and
at least one redundant segment for replacing at least one memory segment of the plurality of memory segments.

8. The system of claim 7, wherein at least one of the memory segments is defective.

9. The system of claim 7, wherein each of the memory segments includes memory cells arranged memory cell groups, wherein at least one of the memory cell groups of at least one of the memory segments is defective.

10. The system of claim 7, wherein the transistor included in a corresponding switching unit among the switching units is configured to switch the corresponding switching unit between the enable and disable modes in response to the signal at the gate of the transistor.

11. The system of claim 7, wherein each of the switching unit includes an input node coupled to the gate of the transistor to receive the signal to switch a corresponding switching unit to the disable mode when the corresponding memory segment is defective, the corresponding switching unit being one of the switching units.

12. The system of claim 7, wherein each of the switching unit includes a control input node coupled to the gate of the transistor to receive the signal to switch the corresponding switching unit to the enable mode when the corresponding memory segment is non-defective, the corresponding switching unit being one of the switching units.

* * * * *